(12) United States Patent
Yagura

(10) Patent No.: US 6,310,368 B1
(45) Date of Patent: Oct. 30, 2001

(54) SEMICONDUCTOR DEVICE AND METHOD FOR FABRICATING SAME

(75) Inventor: Motoji Yagura, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/345,945

(22) Filed: Jul. 1, 1999

(30) Foreign Application Priority Data

Jul. 2, 1998 (JP) ................................... 10-187940

(51) Int. Cl.7 ............................................... H01L 31/0328
(52) U.S. Cl. .......................... 257/197; 257/198; 257/586; 257/565; 257/571; 438/235; 438/309; 438/312; 438/317
(58) Field of Search ..................................... 257/197, 198, 257/517, 528, 565, 571, 586, 592, 642, 643; 438/235, 309, 312, 317

(56) References Cited

U.S. PATENT DOCUMENTS

| 5,332,912 | * | 7/1994 | Nozu et al. | ............................ 257/197 |
| 5,729,033 | * | 3/1998 | Hafizi | ................................... 257/198 |
| 6,096,617 | * | 8/2000 | Kizuki | ................................... 438/312 |

FOREIGN PATENT DOCUMENTS 6-69223 A   3/1994   (JP) .

* cited by examiner

Primary Examiner—Tom Thomas
Assistant Examiner—Donghee Kang
(74) Attorney, Agent, or Firm—Nixon & Vanderhye P.C.

(57) ABSTRACT

A semiconductor device includes: a semiconductor layered structure including a predetermined mesa portion, formed on a semiconductor substrate; a support member formed so as to bury the mesa portion; and an interconnection layer formed on a top surface of the semiconductor layered structure so as to extend over a top surface of the support member. The interconnection layer is in contact with only a top surface of the mesa portion without being in contact with a bottom surface of the mesa portion. The top surface of the support member has a smoothed profile, and the top surface of the mesa portion and the smoothed top surface of the support member are in substantially the same plane.

11 Claims, 12 Drawing Sheets

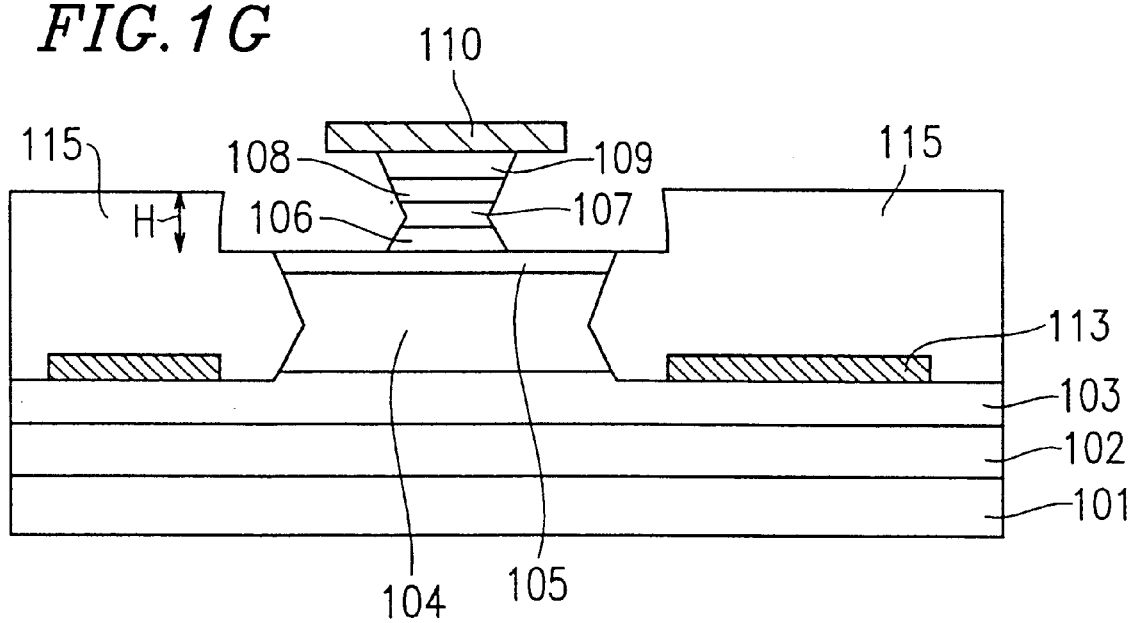
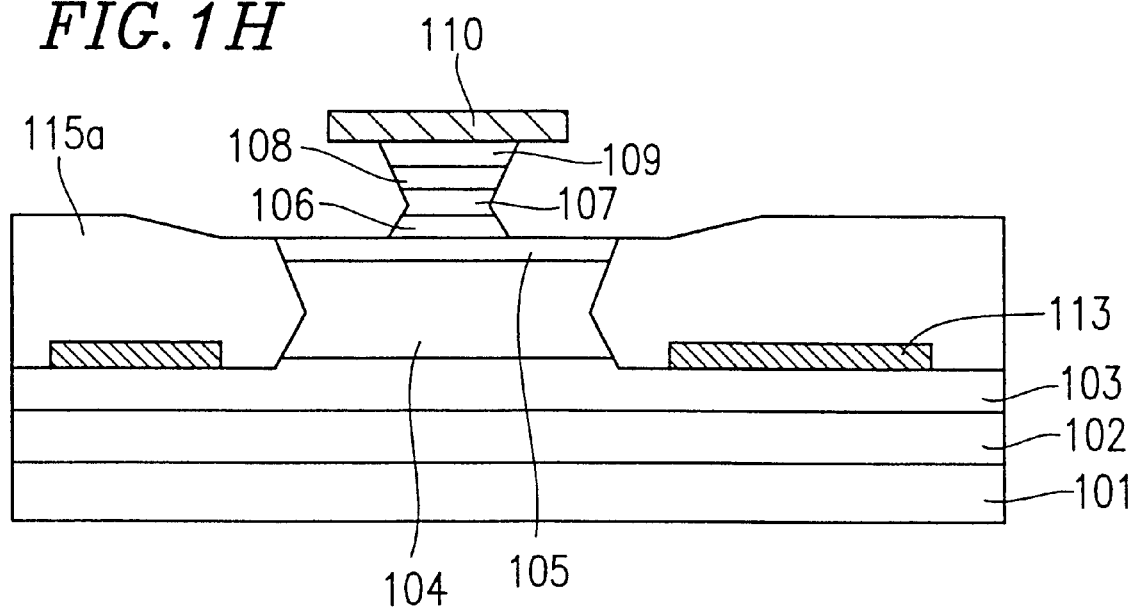

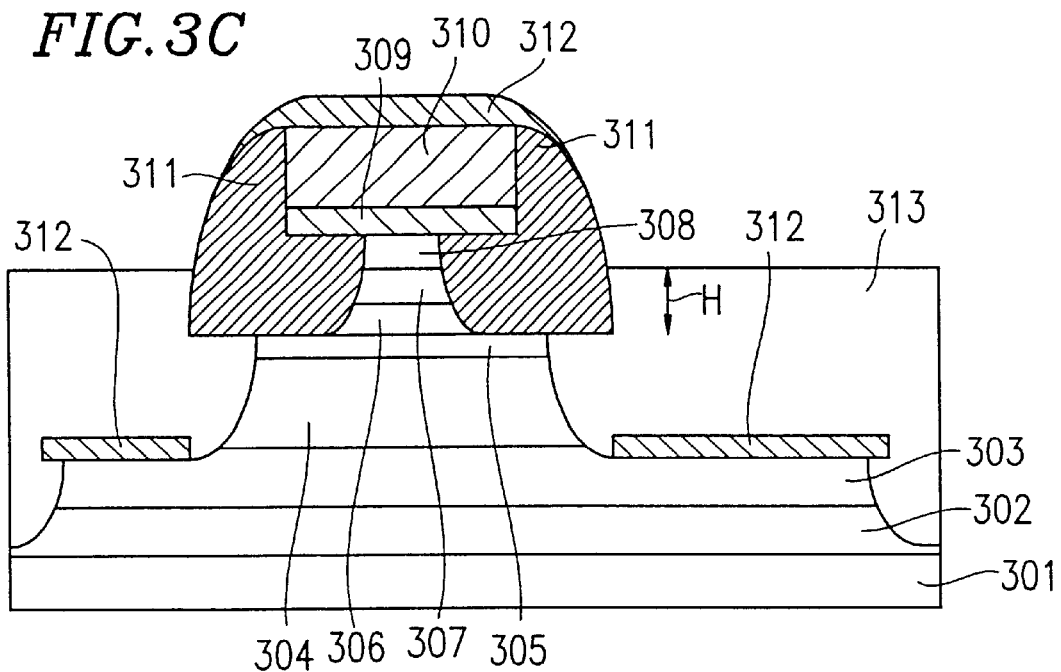
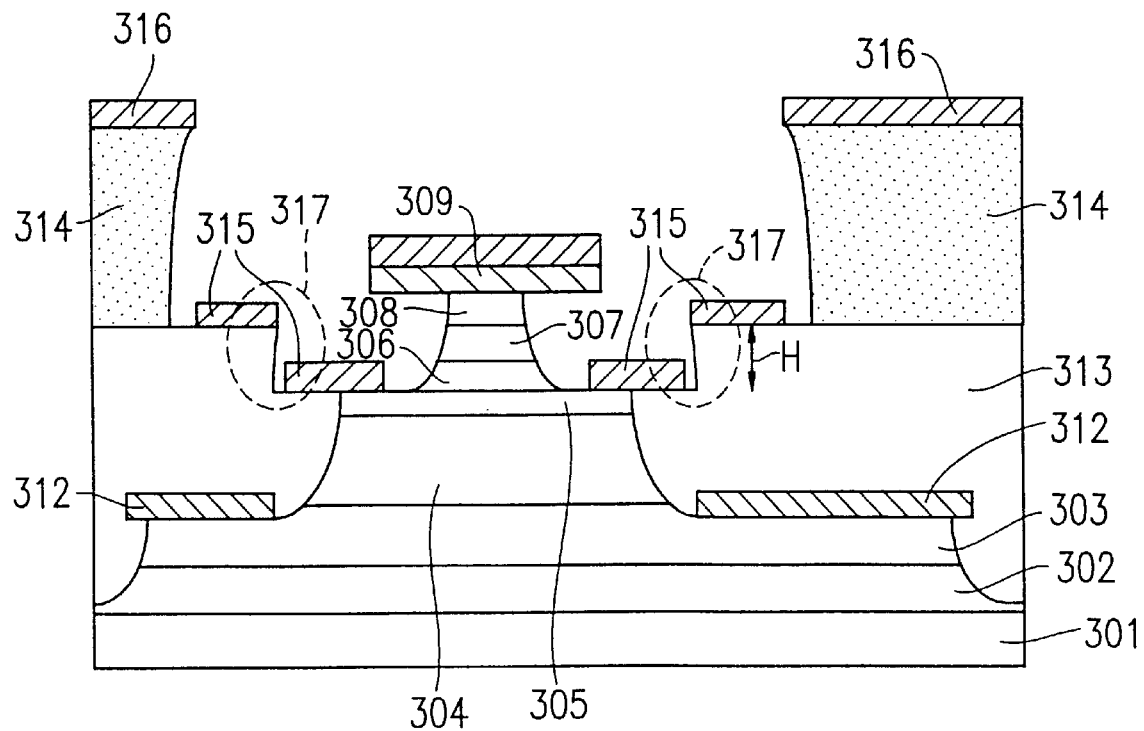

US 6,310,368 B1

SEMICONDUCTOR DEVICE AND METHOD FOR FABRICATING SAME

BACKGROUND OF THE INVENTION

1. FIELD OF THE INVENTION

The present invention relates to a method for fabricating a semiconductor device, more particularly, to a method for forming interconnections. The present invention also relates to a semiconductor device having interconnections formed by the above method.

2. DESCRIPTION OF THE RELATED ART

In recent years, in order to realize high integration of hetero-junction bipolar transistors (HBTs), a reduction in the size of HBTs has become requisite. In particular, a method for fabrication of HBTs which can realize a reduction in the size of base mesas and self-aligned formation of base electrodes has been required.

Hereinbelow, as one conventional method for fabricating a semiconductor device, a fabrication process disclosed in Japanese Laid-Open Publication No. 6-69223 will be described with reference to FIGS. 3A to 3D.

Referring to FIG. 3A, an i-type GaAs buffer layer 302, an $n^+$-type GaAs sub-collector layer 303, an n-type GaAs collector layer 304, a $p^+$-type GaAs base layer 305, an n-type AlGaAs emitter layer 306, a graded layer 307 made of n-type InGaAlAs and the like, and an $n^+$-type InGaAs cap layer 308 are sequentially formed by epitaxial growth on a semi-insulating GaAs substrate 301. Then, a conductive layer 309 for formation of an emitter electrode and an $SiO_2$ layer 310 are deposited on the cap layer 308. A photoresist mask of a predetermined pattern is then formed on the resultant structure to pattern the conductive layer 309 and the $SiO_2$ layer 310. Using the patterned conductive layer 309 and $SiO_2$ layer 310 as a mask, the cap layer 308, the graded layer 307, and the emitter layer 306 are etched to form an emitter mesa with the base layer 305 being exposed on both sides of the emitter mesa.

Referring to FIG. 3B, a thick $SiO_2$ layer is formed to cover the entire surface of the resultant structure, and then partly removed by anisotropic etching to form side-wall type dummy bases 311. Then, using the dummy bases 311 as a mask, the base layer 305, the collector layer 304, and a surface portion of the sub-collector layer 303 are partly removed by isotropic etching to form a base mesa. Subsequently, collector electrodes 312 are formed on the exposed surface of the sub-collector layer 303 on both sides of the base mesa by an appropriate method. Simultaneously with the formation of the collector electrodes 312, a conductive layer, which is also denoted by 312, is formed on the $SiO_2$ layer 310 located on the conductive layer 309 and the dummy bases 311 formed on both sides of the $SiO_2$ layer 310.

A photoresist mask (not shown) of a predetermined pattern is then formed and used to remove regions of the sub-collector layer 303 and regions of the upper portion of the buffer layer 302 underlying peripheral portions of the collector electrodes 312 by etching, so as to form a collector mesa.

Referring to FIG. 3C, a planarizing insulating film 313 made of polyimide is applied to the resultant structure so as to cover the collector mesa formed in the above step, to planarize the resultant structure. Then, the surface portion of the planarizing insulating film 313 in the vicinity of the emitter mesa is etched back to a position near the base layer 305.

Referring to FIG. 3D, the dummy base 311 is then removed by a treatment with hydrofluoric acid and the like. Subsequently, a photoresist mask 314 of a predetermined pattern is formed, and then conductive layers 315 for formation of base electrodes is deposited. This deposition process allows for formation of the base electrodes 315 in a self-aligning manner with respect to the emitter electrode 309 (note that FIG. 3D shows an unfavorable example where the base electrodes 315 are disconnected, as will be described hereinafter).

Simultaneously with the formation of the conductive layers 315, conductive layers 316 are also formed on the photoresist mask 314. However, such unnecessary conductive layers 316 are lifted off when the photoresist mask 314 is removed. In this way, a basic structure of the HBT is completed.

Thus, the base mesa is formed in a self-aligning manner by using the side-wall type dummy bases 311. In particular, the distance L between the edge of the top surface of the base mesa and the side wall of the emitter electrode 309 (see FIG. 3B) is controlled by the thickness of the $SiO_2$ film at the formation of the dummy bases 311 and the conditions of the dry etching. As a result, the size of the base mesa can be reduced compared with the case where the base mesa is formed by being patterned in a photolithographic process, and thus the parasitic capacitance at the base-collector junction can be greatly reduced.

However, the above conventional method using the dummy bases 311 has the following problems.

In order to facilitate the formation of interconnections extending from the base electrodes 315, the base electrodes 315 need to be formed not only on the base layer 305, but also continuously on the planarizing insulating film 313 located adjacent to the base layer 305.

As described with reference to FIG. 3C, part of the planarizing insulating film 313 is etched back to a position near the base layer 305. In this etch-back process, it is extremely difficult to stop the etching accurately and with good reproducibility, at the very moment when the base layer 305 is exposed. Moreover, partly because of uniformity of the planarizing insulating film 313 in the wafer plane, the above etch-back process results in forming a step H between the top surface of the base layer 305 and the top surface of the planarizing insulating film 313. As a result, as shown in circled areas denoted by the reference numeral 317 in FIG. 3D, each base electrode 315 is formed over upper and lower surfaces having the step H therebetween. Furthermore, the recess portion formed by the steps H normally has an inverted tapered shape as shown in the circled areas 317.

The thickness of the base electrodes 315 is typically set to be about 200 nm or less in order to prevent short-circuiting with the emitter electrode 309. Accordingly, if the height of the step H between the top surface of the base layer 305 and the top surface of the planarizing insulating film 313 is greater than the thickness of the deposited conductive layer 315, the portion of the conductive layer 315 formed on the base layer 305 and the portion of the conductive layer 315 formed on the planarizing insulating film 313 are separated from each other vertically, causing electric disconnection and thus reducing fabrication yield.

SUMMARY OF THE INVENTION

A semiconductor device of the present invention includes: a semiconductor layered structure including a predetermined mesa portion, formed on a semiconductor substrate; a support member formed so as to bury the mesa portion; and an interconnection layer formed on a top surface of the semiconductor layered structure so as to extend over a top surface of the support member. The interconnection layer is in contact with only a top surface of the mesa portion without being in contact with a bottom surface of the mesa portion. The top surface of the support member has a smoothed profile, and the top surface of the mesa portion and the smoothed top surface of the support member are in substantially the same plane.

In one embodiment, the support member is made of a material which is thermally deformable.

In another embodiment, the support member is made of a material which swells with a solvent.

In still another embodiment, the support member is made of polyimide.

For example, the top surface of the mesa portion may include a top surface of a base layer of the semiconductor layered structure, and the support member may include an insulating film.

A method for fabricating a semiconductor device according to the present invention includes the steps of: forming a semiconductor layered structure on a semiconductor substrate; forming a predetermined mesa portion in the semiconductor layered structure using a predetermined etching mask; forming a support member on the semiconductor layered structure including the mesa portion so as to bury the mesa portion; etching back the support member to reach a position near a top surface of the mesa portion; removing the etching mask; smoothing a profile of a top surface of the support member so that the top surface of the mesa portion and the smoothed top surface of the support member are on substantially the same height level; and forming an interconnection layer on a top surface of the semiconductor layered structure so as to extend over the support member.

In one embodiment, the support member is made of a material which is thermally deformable, and the smoothing step includes a heat treatment of the support member.

Preferably, the heat treatment is performed at a temperature equal to or more than a softening temperature of the material of the support member.

In another embodiment, the support member is made of a material which swells with a solvent, and the smoothing step includes a treatment of the support member with a solvent.

In still another embodiment, the support member is made of polyimide.

In the etching-back step, the etching-back of the support member is preferably stopped at a position above an interface between the top surface of the mesa portion and the top surf ace of the support member when side etching is not provided below the etching mask.

For example, the top surface of the mesa portion may include a top surface of a base layer of the semiconductor layered structure, and the support member may include an insulating film.

Thus, according to the present invention, a predetermined mesa portion is formed by etching a semiconductor layered structure formed on a semiconductor substrate using an etching mask. An insulating film (support member) serving as an interlayer insulating film is formed on the entire surface of the resultant layered structure including the mesa portion, and then etched back to reach a position near the top surface of the mesa portion. After removal of the etching mask, heat treatment or chemical treatment is performed so that the top surface of the mesa portion and the top surface of the support member, formed so as to bury the mesa portion therein, are positioned on substantially the same height level. At the same time, the cross-sectional profile of the support member (interlayer insulating film) is smoothed.

Thus, by using the surface tension generated when the support member (interlayer insulating film) is planarized, the top surface of the support member is smoothed so as not to include a stepped portion therein, and the height difference between the top surface of the mesa portion (e.g., the top surface of a base layer included in the mesa portion) and the top surface of the support member (the interlayer insulating film) is smoothed.

By the above smoothing, disconnection in an interconnection layer, which otherwise tends to occur due to existence of a stepped portion, is prevented even when the interconnection layer is formed over the support member (the interlayer insulating film) and the mesa portion across the interface therebetween.

Thus, the invention described herein makes possible the advantages of providing (1) a semiconductor device capable of reducing the size of the base mesa to reduce the base-collector junction capacitance and preventing disconnection of the base electrode to improve fabrication yield, and (2) a method for fabricating such a semiconductor device.

These and other advantages of the present invention will become apparent to those skilled in the art upon reading and understanding the following detailed description with reference to the accompanying figures.

BRIEF DESCRIPTION OF THE DRAWINGS

FIGS. 1A to 1L are cross-sectional views illustrating steps of a method for fabricating a semiconductor device according to the present invention;

FIGS. 3A to 3D are cross-sectional views illustrating steps of a conventional method for fabricating a semiconductor device.

DESCRIPTION OF THE PREFERRED EMBODIMENTS

EXAMPLE 1

The method for fabricating a semiconductor device according to Example 1 of the present invention will be described with reference to FIGS. 1A to 1L.

Figure 1A:
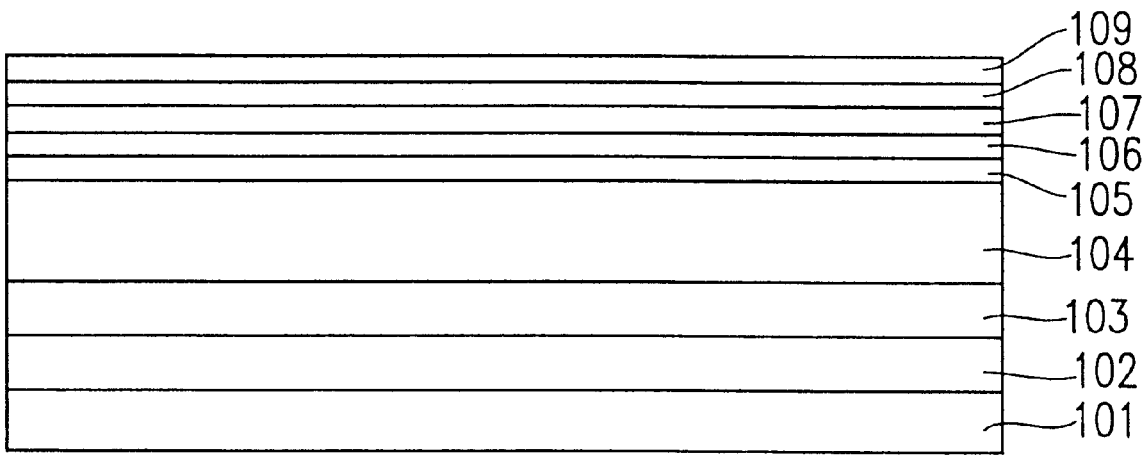

Referring to FIG. 1A, a buffer layer 102 is formed on a semi-insulating GaAs substrate 101 by molecular beam epitaxy (MBE) or metal-organic chemical vapor deposition (MOCVD). On the buffer layer 102, an n-type GaAs sub-collector layer 103 (Si doping concentration: about $5 \times 10^{18}$ $cm^{-3}$, thickness: about 500 nm), an n-type GaAs collector layer 104 (Si doping concentration: about $2 \times 10^{16}$ $cm^{-3}$, thickness: about 700 nm), a p-type GaAs base layer 105 (C doping concentration: about $2 \times 10^{19}$ $cm^{-3}$, thickness: about 80 nm), an n-type $In_{0.5}Ga_{0.5}P$ emitter layer 106 (Si doping concentration: about $5 \times 10^{17}$ $cm^{-3}$, thickness: about 70 nm), an n-type GaAs contact layer 107 (Si doping concentration: about $5 \times 10^{17}$ $cm^{-3}$, thickness: about 50 nm), an n-type $In_xGa_{I-x}As$ graded layer 108 (Si doping concentration: about $1 \times 10^{19}$ $cm^{-3}$, thickness: about 50 nm, x varies in the range of 0 to 0.5), and an n-type $In_{0.5}Ga_{0.5}As$ cap layer 109 (Si doping concentration: about $1\times10^{19}$ cm$^{-3}$, thickness: about 50 nm) are sequentially formed by epitaxial growth.

Figure 1B:
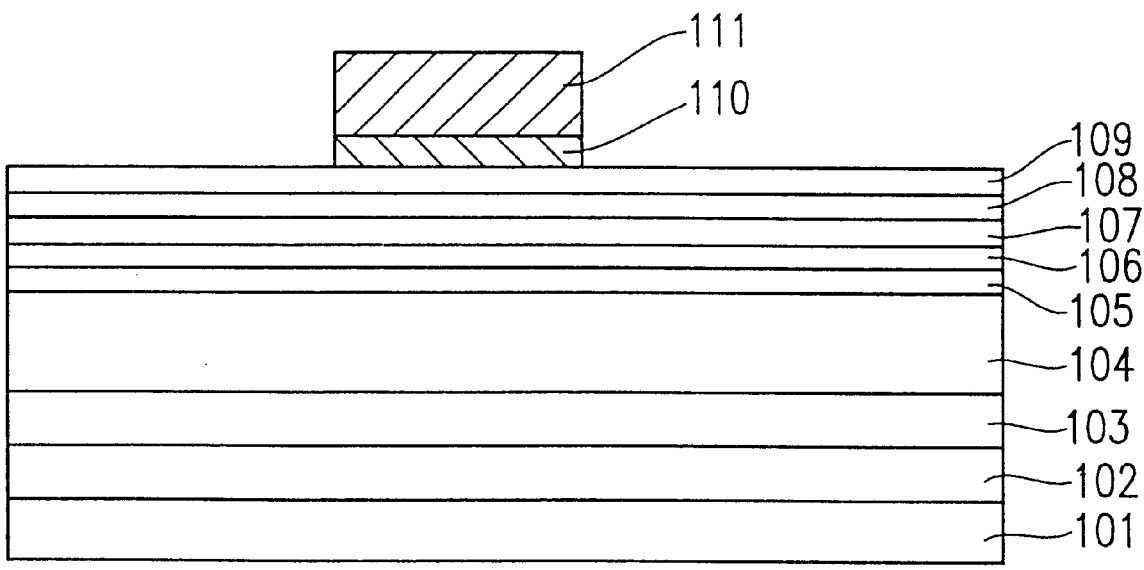

Referring to FIG. 1B, a conductive layer 110 for formation of an emitter electrode made of tungsten nitride (WN) having a thickness of about 100 nm, and a mask layer 111 made of an SiN film having a thickness of about 700 nm are sequentially formed so as to cover the entire surface of the cap layer 109. The thickness of the mask layer 111 can be used to control the width of side walls to be formed in a later step. More specifically, if the width of side walls is desired to be large, the mask layer 111 is deposited to be thick. The width of the side walls is required to be large when a base mesa described hereinafter is desired to be large. The mask layer 111 may be an SiO$_2$ film, instead of the SiN film.

Thereafter, a photoresist mask (not shown) of a predetermined pattern is formed and used to pattern the mask layer 111 and the emitter electrode layer (conductive layer) 110 by a dry etching process such as RIE, as shown in FIG. 1B.

Figure 1C:
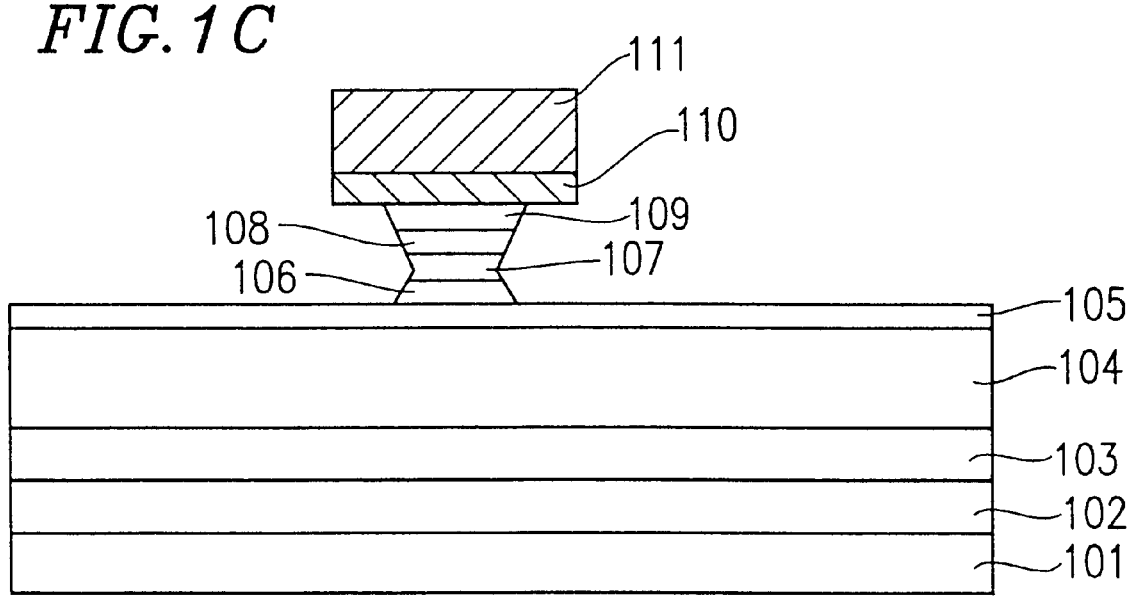

Referring to FIG. 1C, after the photoresist mask is removed, the cap layer 109, the graded layer 108, the contact layer 107, and the emitter layer 106 are wet-etched, by using the patterned emitter electrode layer 110 and mask layer 111 as a mask, into a predetermined shape to form an emitter mesa and expose the base layer 105 on both sides of the emitter mesa.

Figure 1D:
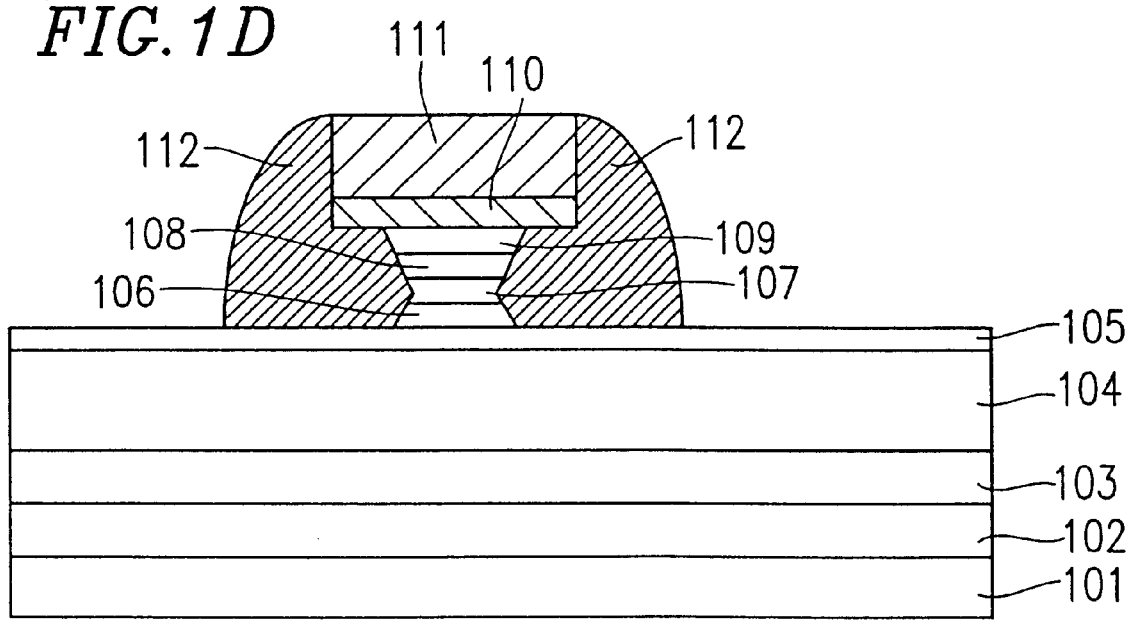

Referring to FIG. 1D, a thick insulating film (SiO$_2$ film or SiN film) having a thickness of about 1 μm is formed to cover the entire surface of the resultant structure by a known method such as CVD, and then subjected to anisotropic dry etching such as RIE, to form side walls 112 on both sides of the emitter mesa.

Figure 1E:
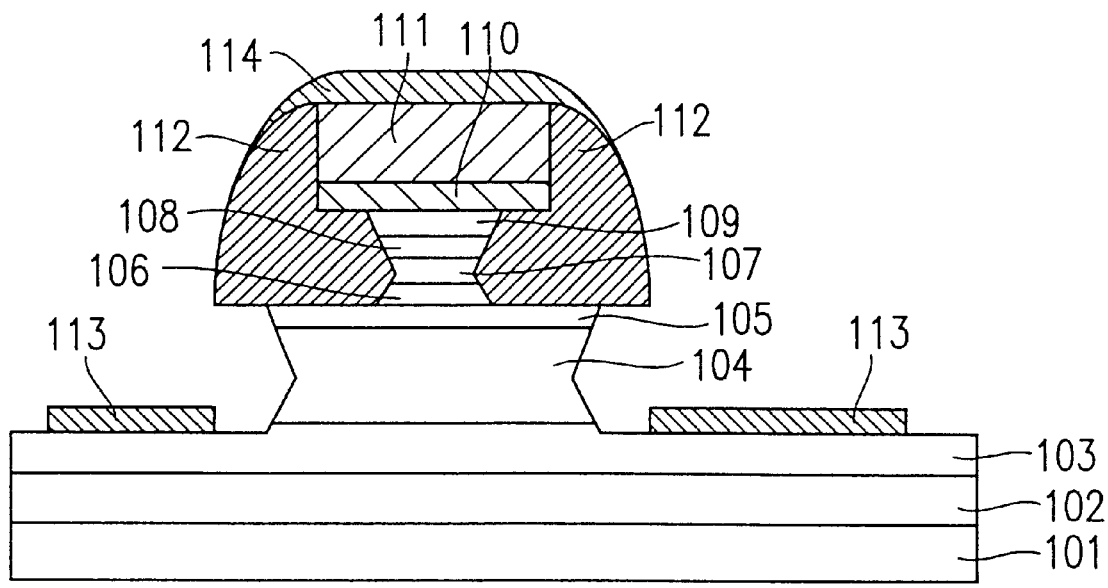

Referring to FIG. 1E, the base layer 105 and the collector layer 104 are partly removed by a wet etching process which uses the thus-formed side walls 112 as a mask until the sub-collector layer 103 is exposed, to form a base mesa. The resultant width of the base mesa is smaller than the length between the external bottom edges of the side walls 112 used as an etching mask due to a side etching effect during the wet etching.

Thereafter, a lift-off process is performed by using a two-layered resist (not shown) so that conductive films 113 and 114 made of AuGe (thickness: about 100 nm)/ Ni (thickness: about 15 nm)/ Au (thickness: about 100 nm) are formed on collector electrode formation regions of the sub-collector layer 103 and on the mask layer 111 and the side walls 112, respectively, by a deposition technique and the like. Since the base mesa has been side-etched during the wet etching, the conductive films 113 formed on the sub-collector 103 are isolated from the conductive film 114 formed on the side walls 112. Thus, the collector electrodes (conductive films) 113 can be formed on the sub-collector layer 113 in a self-aligning manner.

Figure 1F:
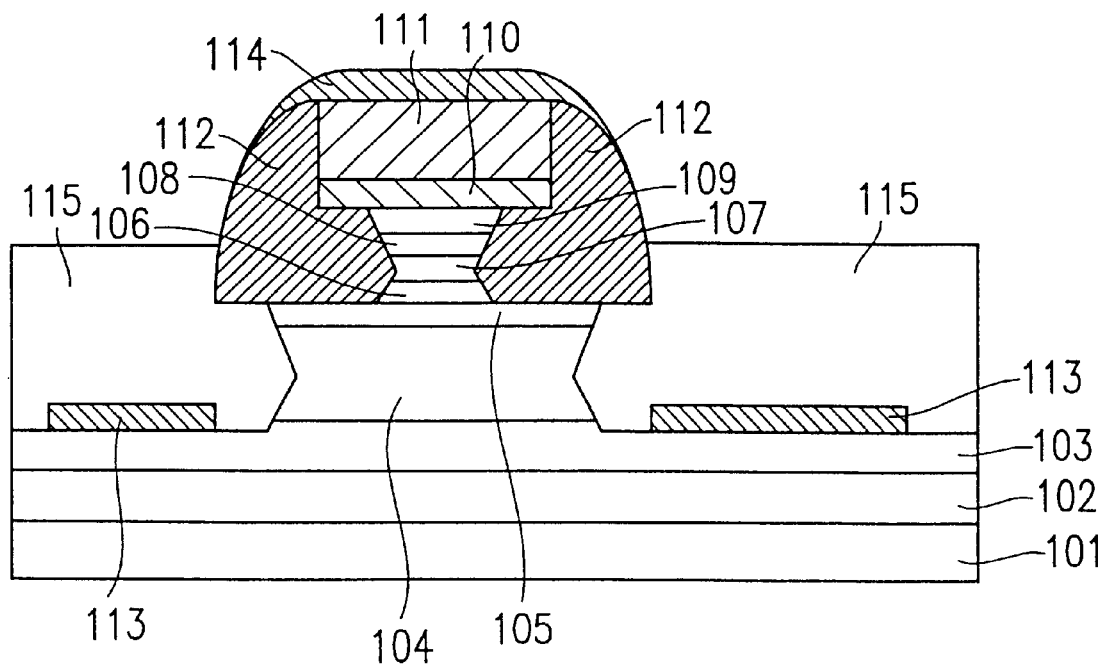

Referring to FIG. 1F, an insulating film 115 made of polyimide serving as an interlayer insulating film is applied so as to cover the collector electrodes 113 formed in the above step and obtain a planarized surface. Thereafter, the surface portion of the insulating film 115 in the vicinity of the emitter mesa is etched back to reach a position near the base mesa, i.e., near the top surface of the base layer 105 as shown in FIG. 1F, by a dry etching method such as RIE. As a result, the insulating film 115 has such a shape as to bury the base mesa therein.

By the existence of the insulating film 115, base electrodes 116b to be formed in a later step are prevented from being in contact with the bottom surface of the base mesa (the top surface of the sub-collector layer 103 and the collector electrodes 113). In other words, the insulating film 115 formed to bury the base mesa therein serves to support the stepped side walls of the base mesa. Thus, the insulating film 115 can be also referred to as a support member 115.

Referring to FIG. 1G, the sidewalls 112 and the mask 111 are removed by etching with hydrofluoric acid. During this etching, the conductive film 114 formed on the side walls 112 is also removed. The resultant profile formed by the top surface of the base layer 105 and the top surface of the polyimide insulating film 115 provides an inverted tapered recess as shown in FIG. 1G due to uniformity in the wafer plane and the reproducibility of the etch-back.

Referring to FIG. 1H, a profile of the top surface of the polyimide insulating film 115 is smoothed by heat treatment at 390° C. The smoothed insulating film 115 is specifically denoted by 115a. In this configuration, there exists little difference in height between the top surface of the portions of the insulating film 115a, in the vicinity of the base layer 105 and the collector layer 104 (i.e., in the vicinity of the base mesa), and the top surface of the base layer 105 (i.e., the top surface of the base mesa). In other words, the smoothed top surface of the insulating film 115a is positioned in substantially the same plane as the top surface of the base layer 105 (i.e., the top surface of the base mesa). As a result, the polyimide insulating film 105a has a comparatively smooth cross-sectional profile.

The difference in height between the top surface of the portion of the insulating film 115a in the vicinity of the base mesa (i.e., in the vicinity of the base layer 105 and the collector layer 104) and the top surface of the electrode contact portion of the base layer 105 (i.e., the top surface of the base mesa) is set at a value greater than the base-collector junction (80 nm or more in this example) and smaller than the thickness of the base electrode (200 nm or less in this example).

Figure 1I:
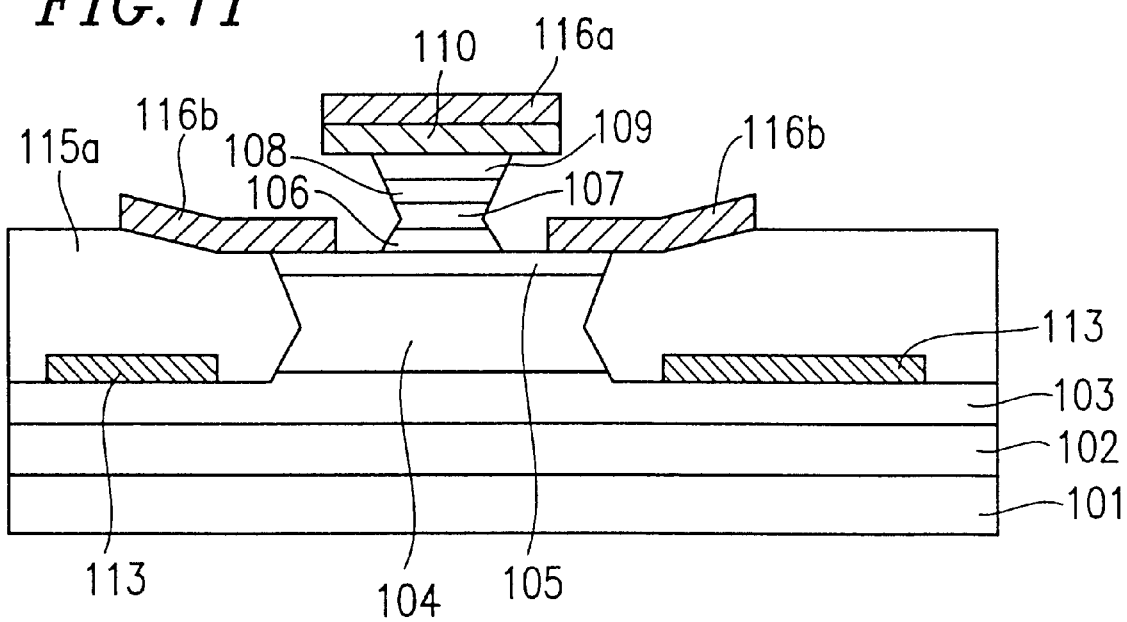

Referring to FIG. 1I, a two-layered resist (not shown) is formed on the entire surface of the resultant structure except for on the emitter electrode layer 110 and regions in which base electrodes are to be formed. By the lift-off process using such a two-layered resist, conductive films 116a and 116b made of Pt (thickness: about 50 nm)/ Ti (thickness: about 50 nm)/ Pt (thickness: about 50 μm)/ Au (thickness: about 50 nm) are formed on the emitter electrode layer 110 and predetermined regions over the base layer 105 and the insulating film 115a by a deposition technique and the like. The resultant conductive films 116b serve as the base electrodes.

Figure 1J:
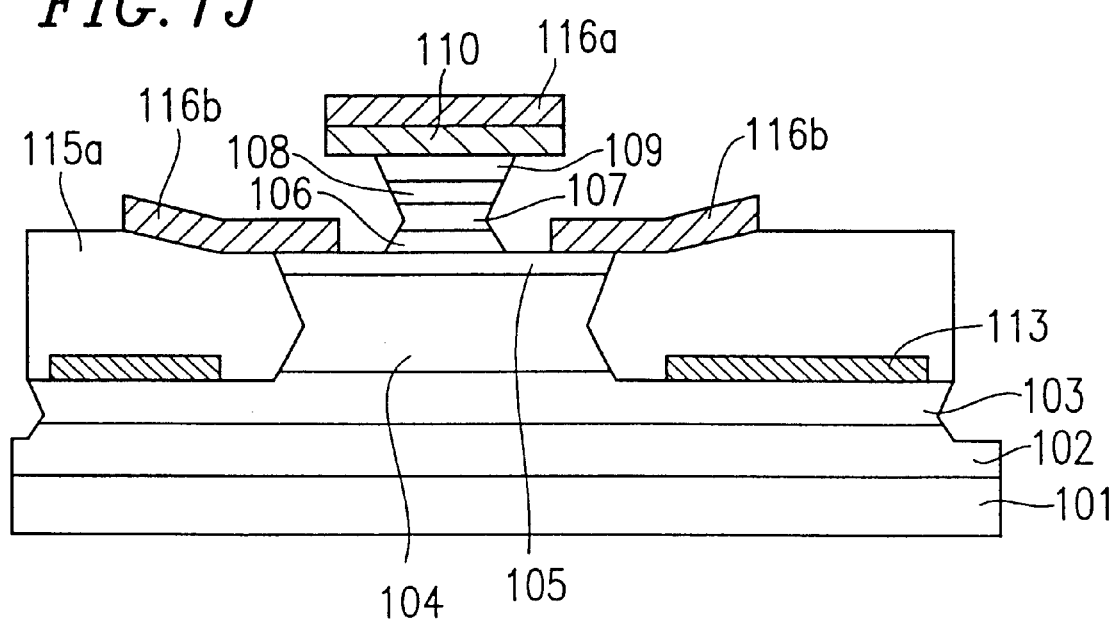

Referring to FIG. 1J, a resist (not shown) of a predetermined pattern is formed on the entire surface of the resultant structure except for regions to be etched for formation of a collector mesa. The insulating film 115a is first etched by RIE and the like using this resist, followed by wet etching of the sub-collector layer 103 until the buffer layer 102 is exposed, to form the collector mesa.

Figure 1K:
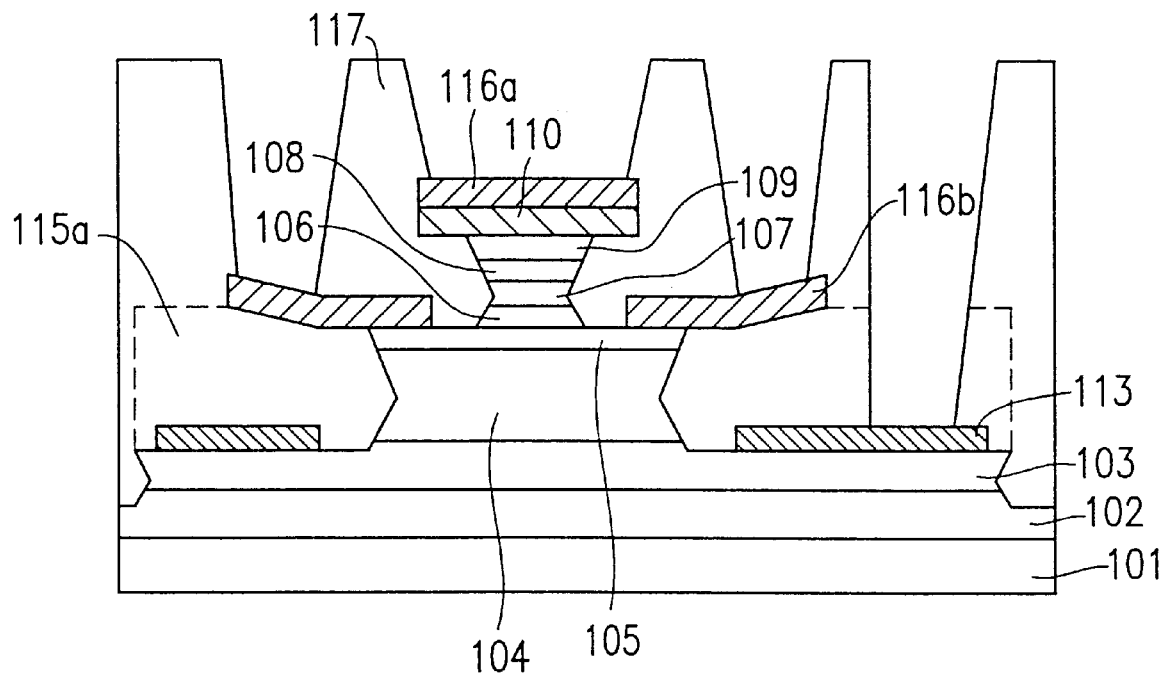

Referring to FIG. 1K, an insulating film 117 made of polyimide is formed over the entire surface of the resultant structure by a spin coating method, and contact formation regions of the insulating film 117 corresponding to the respective electrodes are etched away until the electrodes are exposed by RIE and the like.

Figure 1L:
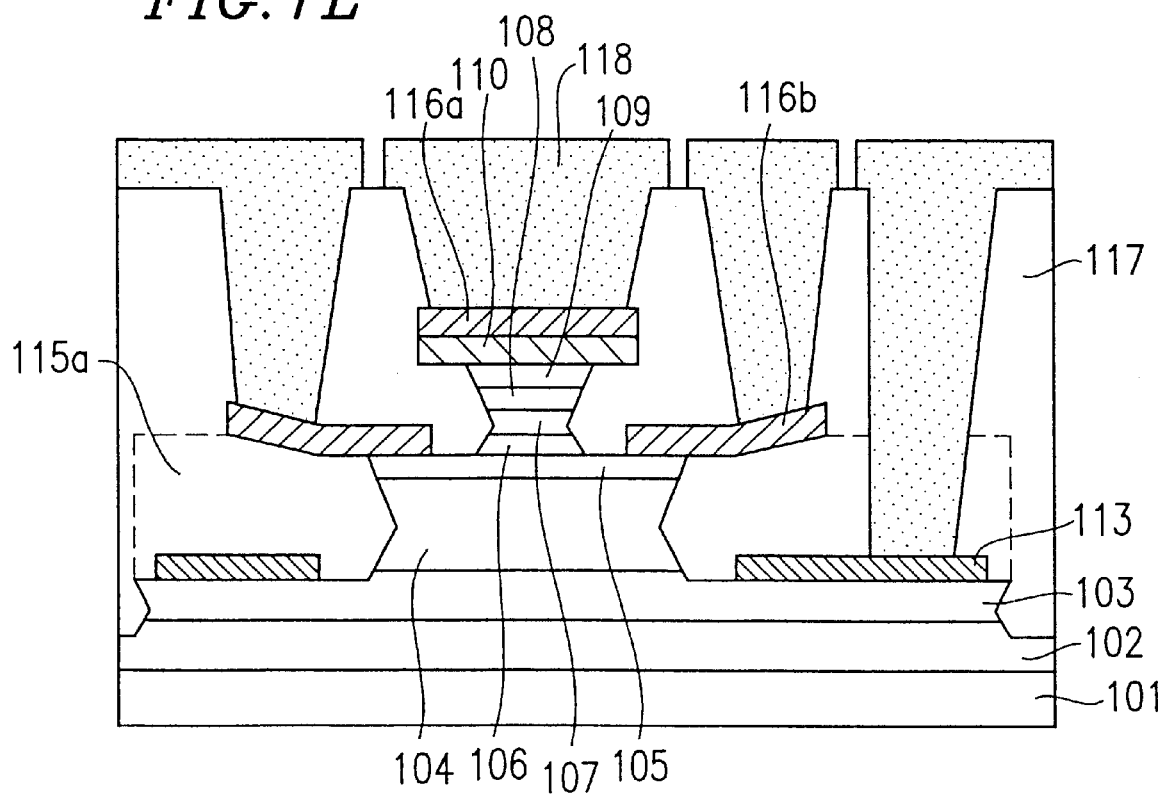

Referring to FIG. 1L, a conductive film 118 made of Ti (thickness: about 100 nm)/ Au (thickness: about 1400 nm) is formed over the entire surface of the resultant structure by a deposition technique and the like. The conductive film 118 is then etched into a predetermined pattern so as to form the interconnection layer pattern 118. Thus, the hetero-junction bipolar transistor (HBT) is completed.

In the thus-fabricated HBT according to the present invention, although the step H exists between the base layer 105 and the insulating film 115 as shown in FIG. 1G, this step H is made less sharp due to the smoothing of the insulating film 115 realized in the subsequent heat treatment as shown in FIG. 1H. As a result, as shown in FIG. 1I, no disconnection occurs in the base electrodes 116b formed in the later step.

In this example, polyimide is used as the material of the insulating film (support member) 115. The support member 115 can be made of other material which is thermally deformable. It is preferable to use such a material that exhibits a contact angle of 15 degrees or more with respect to a semiconductor layer (GaAs layer). Specifically, PSG, BPSG, spin on glass (SOG), benzo-cyclo-butene (BCB), polyallylate, and the like may be used.

In this example, the temperature for the heat treatment for smoothing the insulating film 115 is set at 390° C. in consideration of the glass transfer temperature of polyimide of 370° C. to 380° C. More generally, the temperature for the heat treatment for the above purpose is desirably set at a value equal to or greater than the softening temperature of a material actually used for the insulating film (glass transfer temperature when a glass material is used).

In the step shown in FIG. 1F where the polyimide insulating film 115 is etched back, the etching is stopped when reaching near the top surface of the base mesa (top surface of the base layer 105) in this example. In this regard, the control on when the etch-back process is stopped varies depending on whether or not side-etching is provided below the side walls 112 serving as an etching mask during the etching of the base mesa. This point will be described with reference to FIGS. 2A to 2L, which are enlarged views of the portion in the vicinity of the base layer 105 shown in FIGS. 1F to 1I.

First, the case where side-etching is provided below the side walls 112 serving as an etching mask during the etching of the base mesa will be described.

Figure 2A:
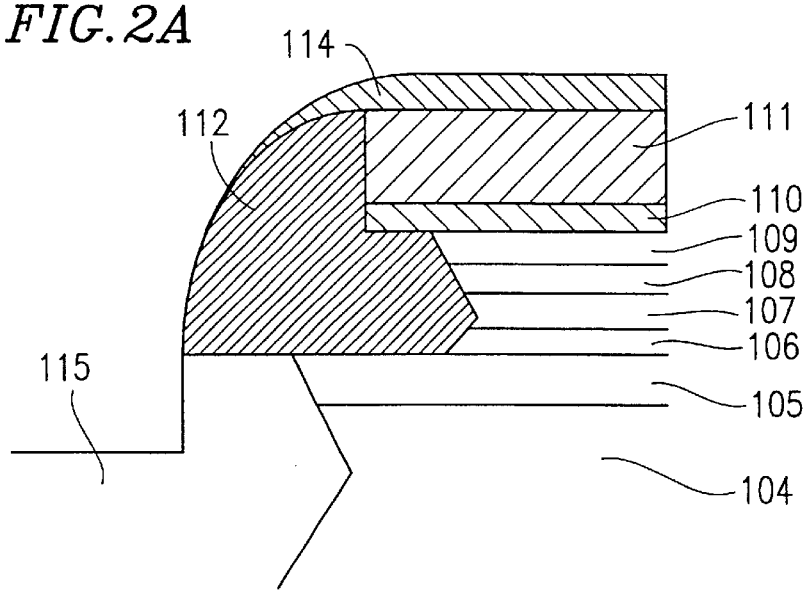
FIGS. 2A to 2L are cross-sectional views illustrating the relationship between the side etching during the mesa etching process and the subsequent etch-back process of an insulating film in the method for fabricating a semiconductor device according to the present invention.
Figure 2B:
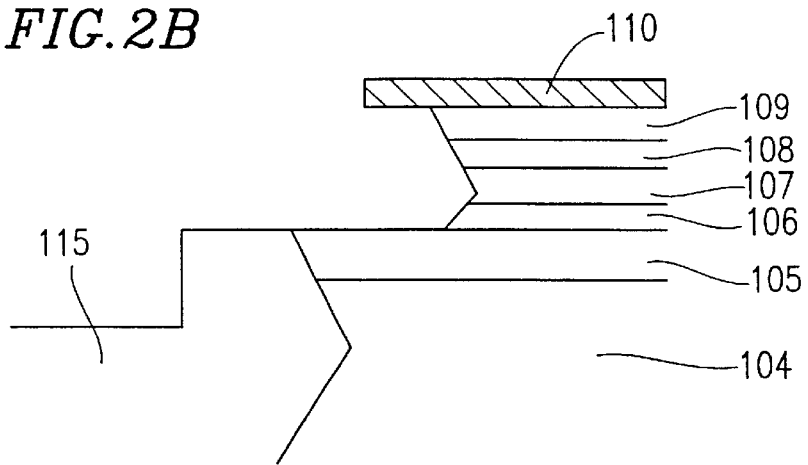
Figure 2C:
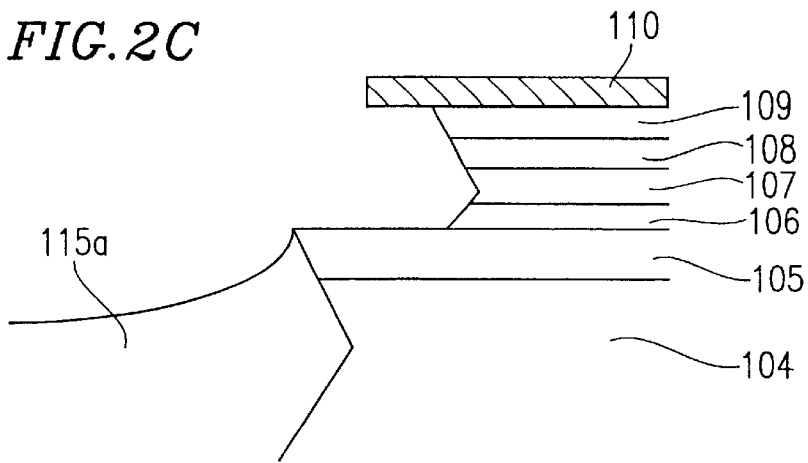
Figure 2D:
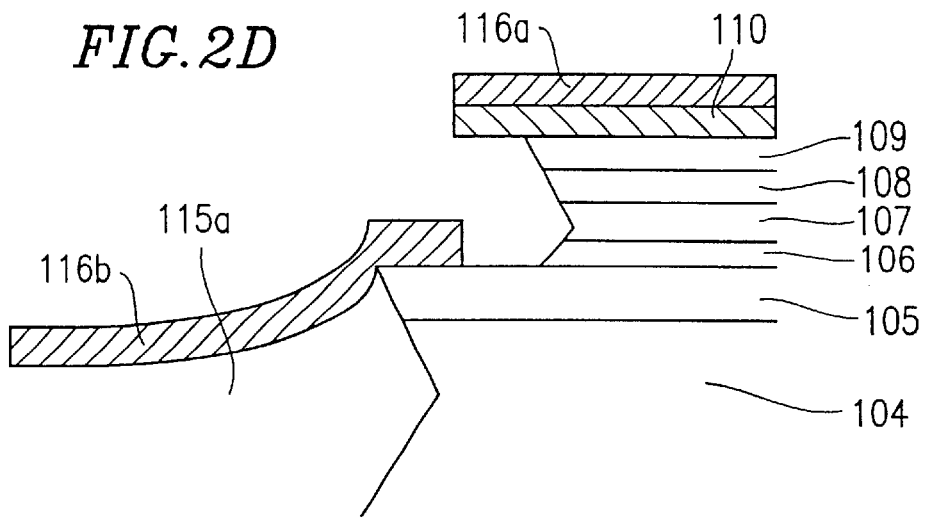

If the etch-back process of the polyimide insulating film 115 is stopped at a position below the interface between the base layer 105 and the side wall 112 as shown in FIG. 2A, a sharp step is formed in the poly imide insulating film 115 after the removal of the side wall 112 and the SiN mask layer 111 by etching in the subsequent step, as shown in FIG. 2B. However, the insulating film 115 is smoothed by the subsequent heat treatment at 390° C. to become the smooth-shaped insulating film 115a as shown in FIG. 2C. No disconnection is therefore generated in the base electrode 116b formed on the insulating film 115a in the later step as shown in FIG. 2D.

Substantially the same result as that described above is obtained if the etch-back process is stopped at a position above the interface between the base layer 105 and the side walls 112.

Thus, in the case where side-etching is provided below the side walls 112 serving as an etching mask during the etching of the base mesa, no problem arises when the etch-back process is stopped at a position below or above the interface between the base layer 105 and the side walls 112.

Next, the case where side-etching is not provided below the side walls 112 serving as an etching mask during the etching of the base mesa will be described.

Figure 2E:
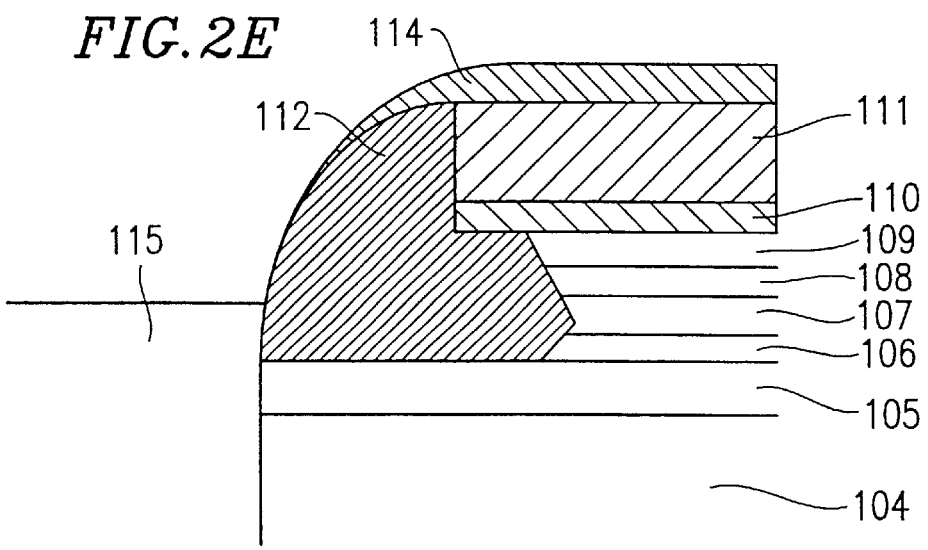
Figure 2F:
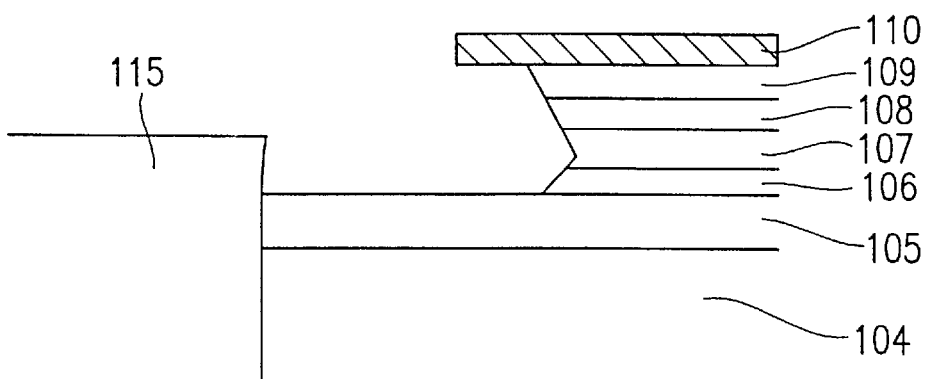
Figure 2G:
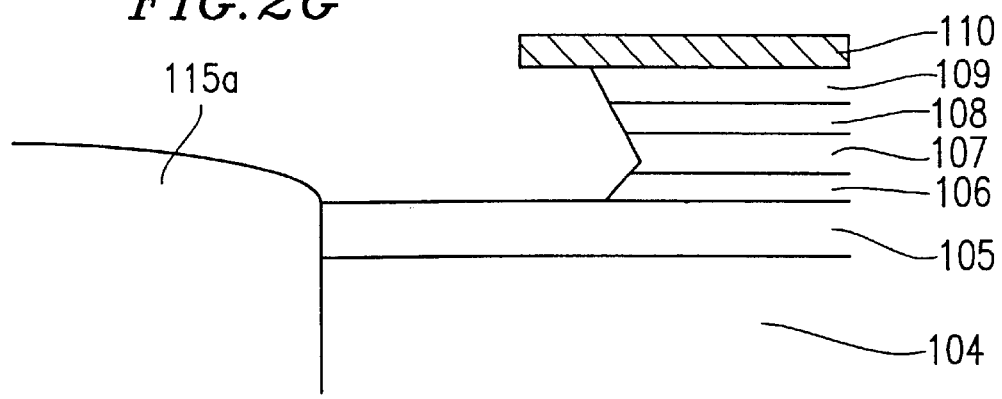
Figure 2H:
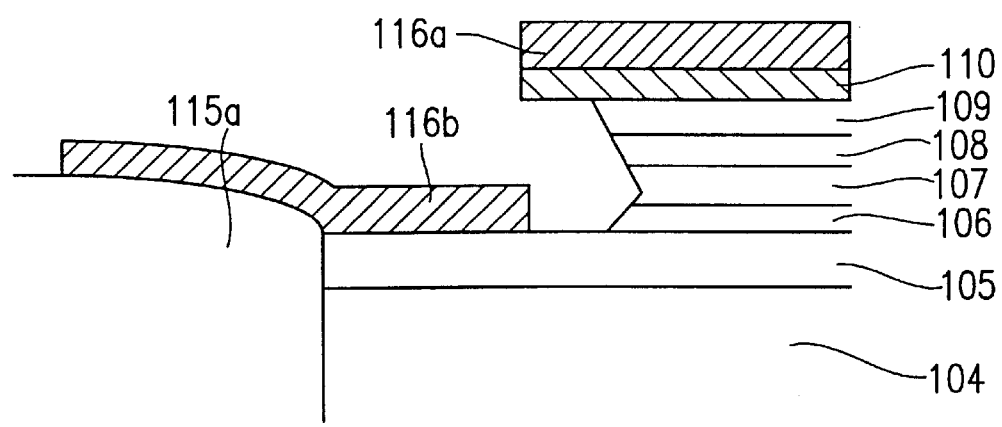

If the etch-back process of the polyimide insulating film 115 is stopped at a position above the interface between the base layer 105 and the side wall 112 as shown in FIG. 2E, a sharp step is formed between the polyimide insulating film 115 and the base layer 105 after the removal of the side wall 112 and the SiN mask layer 111 by etching in the subsequent step, as shown in FIG. 2F. However, since the insulating film 115 is smoothed by the subsequent heat treatment at 390° C. to become the smooth-shaped insulating film 115a as shown in FIG. 2G, no disconnection is generated in the base electrode 116b formed over the insulating film 115a and the base layer 105 in the later step, as shown in FIG. 2H.

Figure 2I:
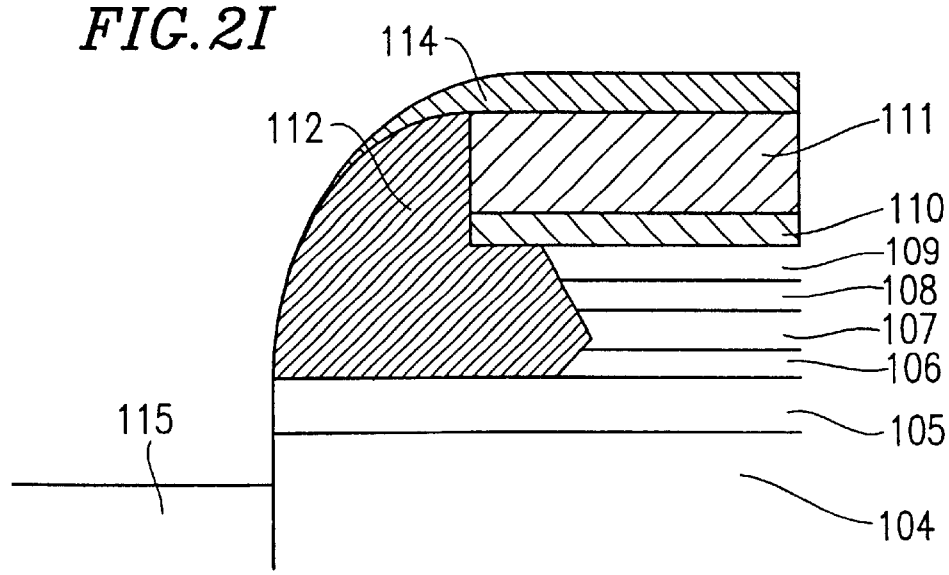
Figure 2J:
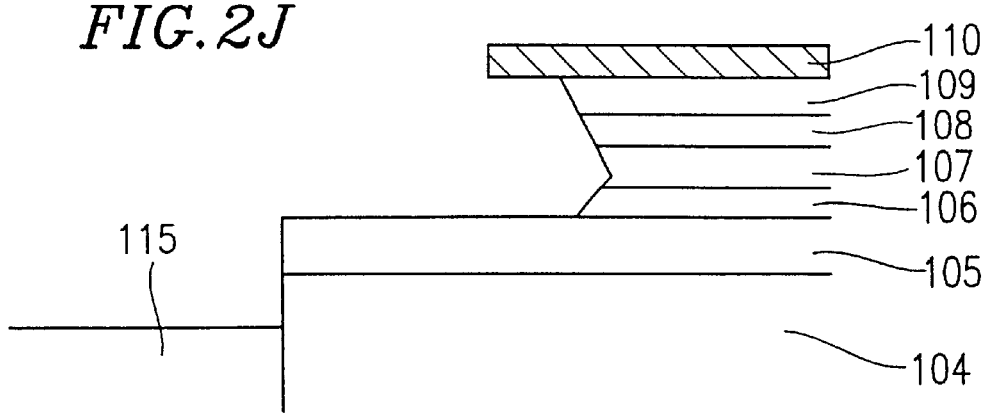
Figure 2K:
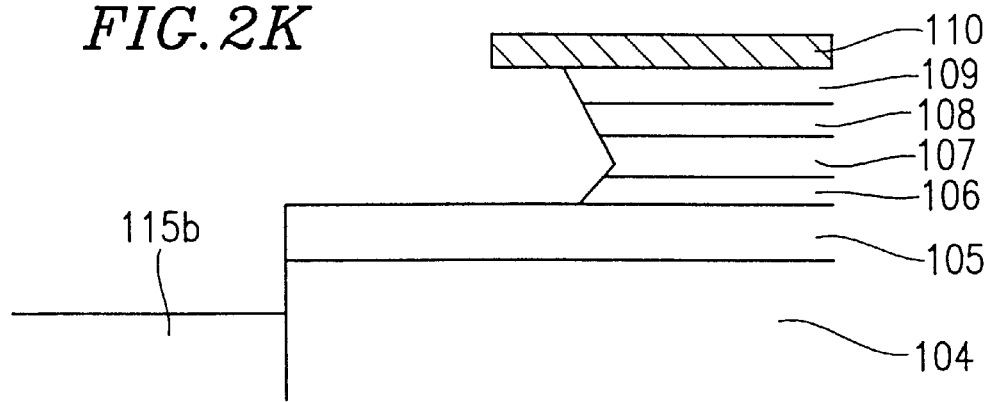
Figure 2L:
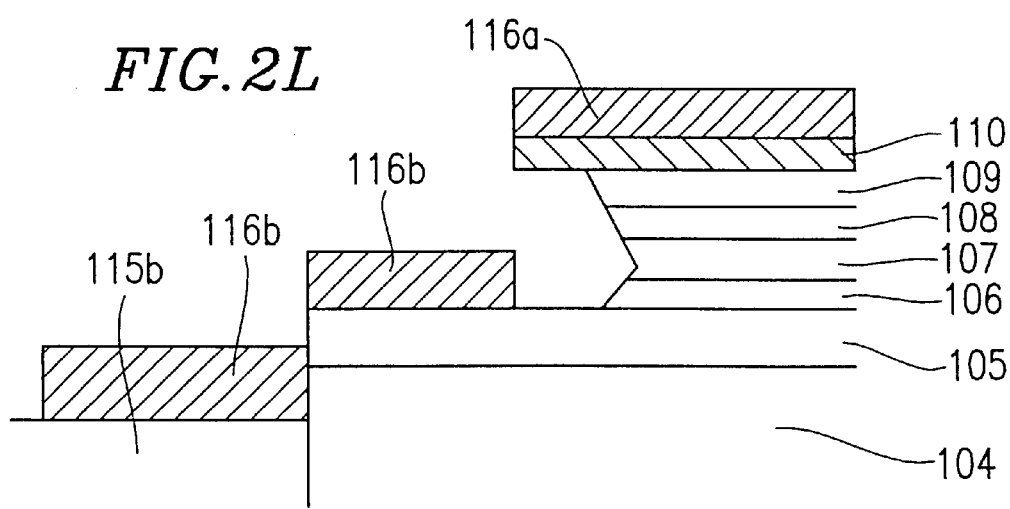
Figure 3A:
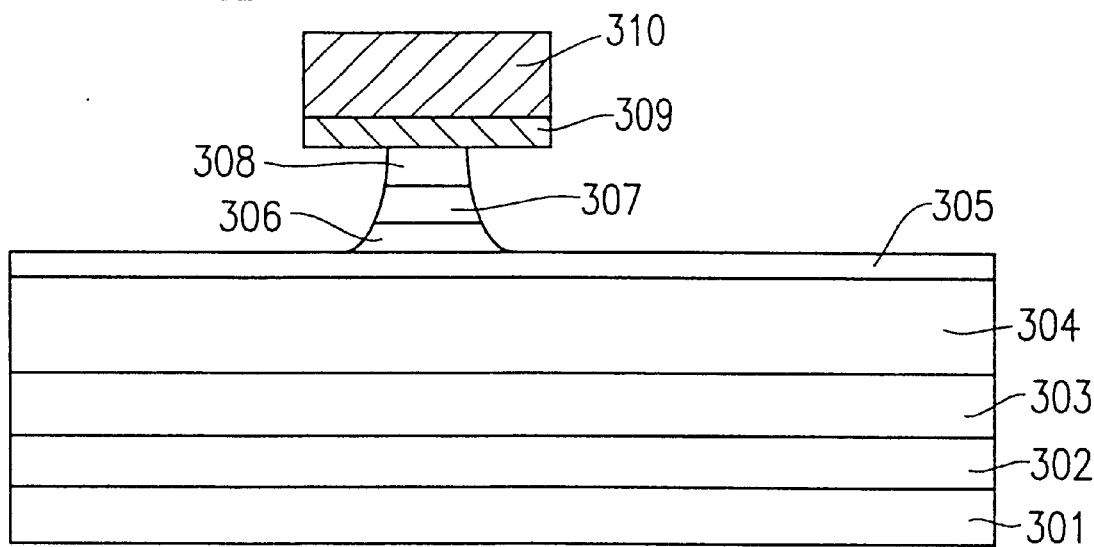
Figure 3B:
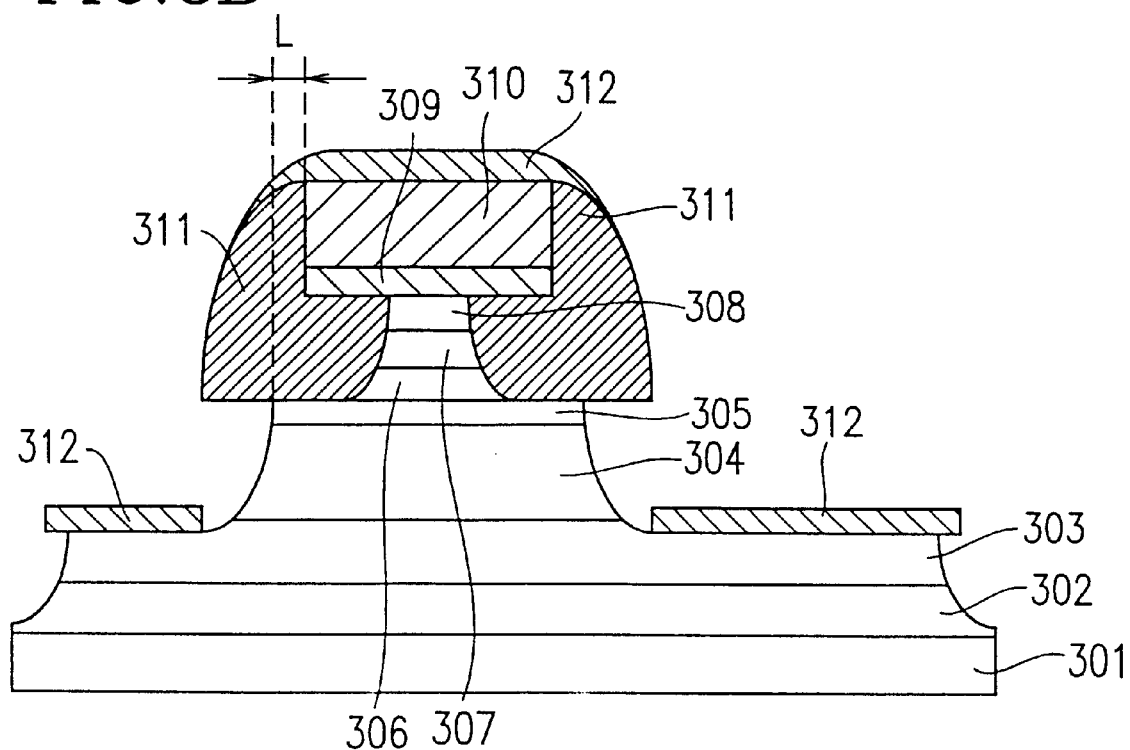

However, if the etch-back process of the polyimide insulating film 115 is stopped at a position below the interface between the base layer 105 and the side wall 112 as shown in FIG. 2I, a sharp step is formed between the polyimide insulating film 115 and the base layer 105 after the removal of the side wall 112 and the SiN mask layer 111 by etching in the subsequent step, as shown in FIG. 2J. In this case, even after the subsequent heat treatment at 390° C., the profile of the resultant insulating film 115b is similar to that before the heat treatment as shown in FIG. 2K. Accordingly, disconnection is generated in the base electrode 116b formed over the insulating film 115b and the base layer 105 in the later step, as shown in FIG. 2L. Moreover, the base electrode 116b comes into contact with the interface between the base layer 105 and the collector 104 at the side wall of the base mesa, causing deterioration in the characteristics of base-collector junction and thereby deterioration in the characteristics of the HBT itself.

Thus, in the case where side-etching is not provided below the side walls 112 serving as an etching mask during the etching of the base mesa, it is necessary to stop the etch-back process at a position above the interface between the base layer 105 and the side walls 112.

EXAMPLE 2

The method for fabricating a semiconductor device according to Example 2 of the present invention will be described with reference to FIGS. 1A to 1L as in Example 1. In this example, the profile of an insulating film (support member) 115 is changed (i.e., smoothed) using a solvent, instead of the heat treatment.

In the process of this example, referring to FIG. 1A, a buffer layer 102 is formed on a semi-insulating GaAs substrate 101 by molecular beam epitaxy (MBE) or metal-organic chemical vapor deposition (MOCVD). On the buffer layer 102, an n-type GaAs sub-collector layer 103 (Si doping concentration: about $5 \times 10^{18}$ cm$^{-3}$ thickness: about 500 nm), an n-type GaAs collector layer 104 (Si doping concentration: about $2 \times 10^{16}$ cm$^{-3}$, thickness: about 700 nm), a p-type GaAs base layer 105 (C doping concentration: about $2 \times 10^{19}$ cm$^{-3}$, thickness: about 80 nm), an n-type $In_{0.5}Ga_{0.5}P$ emitter layer 106 (Si doping concentration: about $5 \times 10^{17}$ cm$^{-3}$, thickness: about 70 nm), an n-type GaAs contact layer 107 (Si doping concentration: about $5 \times 10^{17}$ cm$^{-3}$, thickness: about 50 nm), an n-type $In_xGa_{1-x}As$ graded layer 108 (Si doping concentration: about $1 \times 10^{19}$ cm$^{-3}$, thickness: about 50 nm, x varies in the range of 0 to 0.5), and an n-type $In_{0.5}Ga_{0.5}As$ cap layer 109 (Si doping concentration: about $1 \times 10^{19}$ cm$^{-3}$, thickness: about 50 nm) are sequentially formed by epitaxial growth.

Referring to FIG. 1B, a conductive layer 110 for formation of an emitter electrode made of tungsten nitride (WN) having a thickness of about 100 nm, and a mask layer 111 made of an SiN film having a thickness of about 700 nm are sequentially formed so as to cover the entire surface of the cap layer 109. The thickness of the mask layer 111 can be used to control the width of side walls to be formed in a later step. More specifically, if the width of side walls is desired to be large, the mask layer 111 is deposited to be thick. The width of the side walls is required to be large when a base mesa described hereinafter is desired to be large. The mask layer 111 may be an SiO₂ film, instead of the SiN film.

Thereafter, a photoresist mask (not shown) of a predetermined pattern is formed and used to pattern the mask layer 111 and the emitter electrode layer (conductive layer) 110 by a dry etching process such as RIE, as shown in FIG. 1B.

Referring to FIG. 1C, after the photoresist mask is removed, the cap layer 109, the graded layer 108, the contact layer 107, and the emitter layer 106 are wet-etched, by using the patterned emitter electrode layer 110 and mask layer 111 as a mask, into a predetermined shape to form an emitter mesa with the base layer 105 being exposed on both sides of the emitter mesa.

Referring to FIG. 1D, a thick insulating film (SiO₂ film or SiN film) having a thickness of about 1 $\mu$m is formed by a known method such as CVD so as to cover the entire surface of the resultant structure, and then subjected to anisotropic dry etching such as RIE, to form side walls 112 on both sides of the emitter mesa as shown in FIG. 1D.

Referring to FIG. 1E, the base layer 105 and the collector layer 104 are partly removed by a wet etching process using the thus-formed side walls 112 as a mask until the sub-collector layer 103 is exposed, to form a base mesa. The width of the base mesa is smaller than the length between the external bottom edges of the side walls 112 due to a side etching effect during the wet etching.

Thereafter, a lift-off process is performed by using a two-layered resist (not shown) so that conductive films 113 and 114 made of AuGe (thickness: about 100 nm)/Ni (thickness: about 15 nm)/Au (thickness: about 100 nm) are formed on collector electrode formation regions of the sub-collector layer 103 and on the mask layer 111 and the side walls 112, respectively, by a deposition technique and the like. Since the base mesa has been side-etched during the wet etching, the conductive films 113 formed on the sub-collector 103 are isolated from the conductive film 114 formed on the side walls 112. the collector electrodes (conductive films) 113 can be formed on the sub-collector layer 113 in a self-aligning manner.

Referring to FIG. 1F, an insulating film (i.e. a support member) 115 made of polyimide serving as an interlayer insulating film is applied so as to cover the collector electrodes 113 formed in the above step and to obtain a planarized surface. Thereafter, the surface portion of the insulating film 115 in the vicinity of the emitter mesa is etched back to reach a position near the base mesa, i.e., near the top surface of the base layer 105 as shown in FIG. 1F, by a dry etching method such as RIE.

Referring to FIG. 1G, the side walls 112 and the mask layer 111 are removed by etching with hydrofluoric acid. During this etching, the conductive film 114 formed on the side walls 112 is also removed. The resultant profile formed by the top surface of the base layer 105 and the top surface of the polyimide insulating film 115 provides an inverted tapered recess due to uniformity in the wafer plane and reproducibility of the etch-back process.

Referring to FIG. 1H, a profile of the top surface of the polyimide insulating film 115 is smoothed by a treatment with N-methylpyrrolidone serving as a solvent for polyimide. The smoothed insulating film 115 is specifically denoted by 115a. In this configuration, there exists little difference in height between the top surface of the portions of the insulating film 115a, in the vicinity of the base layer 105 and the collector layer 104 (i.e., in the vicinity of the base. mesa), and the top surface of the base layer 105. (i.e., the top surface of the base mesa). In other words, the smoothed top surface of the insulating film 115a is positioned in substantially the same plane as the top surface of the base layer 105 (i.e., the top surface of the base mesa). As a result, the polyimide insulating film 105a has a comparatively smooth cross-sectional profile.

The difference in height between the top surface of the portions of the insulating film 115a in the vicinity of the base mesa (i.e., in the vicinity of the base layer 105 and the collector layer 104) and the top surface of the electrode contact portion of the base layer 105 (i.e., the top surface of the base mesa) is set at a value greater than the base-collector junction (80 nm or more in this example) and smaller than the thickness of the base electrode (200 nm or less in this example).

The above solvent treatment can be performed by immersing the substrate in the solvent at room temperature for about 30 seconds.

Referring to FIG. 1I, a two-layered resist (not shown) is formed on the entire surface of the resultant structure except for on the emitter electrode layer 110 and regions in which base electrodes are to be formed. By the lift-off process using such a two-layered resist, conductive films 116a and 116b made of Pt (thickness: about 50 nm)/ Ti (thickness: about 50 nm)/ Pt (thickness: about 50 $\mu$m)/ Au (thickness: about 50 nm) are formed on the emitter electrode layer 110 and predetermined regions over the base layer 105 and the insulating film 115a by a deposition technique and the like. The resultant conductive films 116b serve as the base electrodes.

Referring to FIG. 1J, a resist (not shown) of a predetermined pattern is formed on the entire surface of the resultant structure except for etching regions for formation of a collector mesa. The insulating film 115a is first etched by RIE and the like using this resist, followed by wet etching of the sub-collector layer 103 until the buffer layer 102 is exposed, to form the collector mesa.

Referring to FIG. 1K, an insulating film 117 made of polyimide is formed over the entire surface of the resultant structure by a spin coating method, and the contact formation regions of the insulating film 117 corresponding to the respective electrodes are etched away until the electrodes are exposed by RIE and the like.

Referring to FIG. 1L, a conductive film 118 made of Ti (thickness: about 100 nm)/ Au (thickness: about 1400 nm) is formed over the entire surface of the resultant structure by a deposition technique and the like. The conductive film 118 is then etched into a predetermined pattern so as to form the interconnection layer pattern 118. Thus, the HBT is completed.

The thus-fabricated HBT of this example where the insulating film 115 is smoothed by solvent treatment exhibits substantially the same effects as those of Example 1 where the insulating film 115 is smoothed by heat treatment.

In this example, polyimide is used as a material of the insulating film (support member) 115. Alternatively, any material which swells with a solvent can be used. For example, the insulating film (support member) 115 may be made of SOG and an organic solvent suitable for this material may be used as the above solvent.

In the above examples, the present invention is applied to the npn-type transistors. Alternatively, a pnp-type transistor can be used. In the above examples, the emitter-up type transistor where the emitter is formed in an upper portion is used. Alternatively, a collector-up type transistor where the collector is formed in an upper portion may be used.

In the above examples, the InGaP/GaAs type compound semiconductor materials are used where the emitter is made of InGaP and the base and the collector are made of GaAs. Alternatively, the semiconductor device (HBT) of the present invention may be formed of an AlGaAs/GaAs type compound semiconductor materials where the emitter is made of AlGaAs and the base and the collector are made of GaAs, an InP/InGaAs type compound semiconductor materials where the emitter is made of InP and the base and the collector are made of InGaAs, or an InAlAs/InGaAs type compound semiconductor materials where the emitter is made of InAlAs and the base and the collector are made of InGaAs. Furthermore, other semiconductor materials (e.g., SiGe) may also be used.

Thus, according to the present invention, the top surface of a support member serving as an interlayer insulating film and the top surface of a predetermined mesa portion are positioned on substantially the same height level, and the cross-sectional profile of the support member is made smooth. More specifically, the step between the top surface of the mesa portion (e.g., the top surface of a base layer included in a base mesa) and the top surface of the support member (i.e., the interlayer insulating film) is smoothed using the surface tension generated when the support member is planarized. Moreover, the top surface of the support member is smoothed so as not to include a stepped portion therein.

By the above smoothing, disconnection in an interconnection layer, which otherwise tends to occur due to existence of a step, is prevented even when the interconnection layer is formed over the support member (interlayer insulating film) and the mesa portion across the interface therebetween.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising:
   a semiconductor layered structure including a predetermined mesa portion comprising a base layer of a transistor, formed on a semiconductor substrate;
   a support member formed so as to bury the mesa portion; and
   an interconnection layer formed on at least a portion of a top surface of the semiconductor layered structure so as to extend over at least a portion of a top surface of the support member;
   wherein the interconnection layer is in contact with a top surface of the mesa portion without being in contact with a bottom surface of the mesa portion;
   wherein the top surface of the support member comprises a smoothed profile transitioning from a first height to a second height different from the first height, wherein the first height is substantially the same height as the top surface of the mesa portion; and
   wherein the top surface of the base layer of the transistor in the mesa portion and the smoothed top surface of the support member are in substantially the same plane proximate the interface thereof.

2. A semiconductor device according to claim 1, wherein the support member is made of a material which is thermally deformable.

3. A semiconductor device according to claim 1, wherein the support member is made of a material which swells with a solvent.

4. A semiconductor device according to claim 1, wherein the support member is made of polyimide.

5. A semiconductor device according to claim 1, wherein the top surface of the mesa portion comprises a top surface of a base layer of the semiconductor layered structure, and the support member comprises an insulating film.

6. The semiconductor device of claim 1, wherein the second height is at a greater elevation than the first height relative to the top surface of the mesa portion.

7. The semiconductor device of claim 1, wherein the difference in height between the first and second heights of the top surface of the support member is equal to a step height formed in the top surface of the support member during fabrication of the semiconductor device.

8. The semiconductor device of claim 1, wherein the difference in height between the first and second heights of the top surface of the support member is greater than a thickness of a base electrode of the semiconductor device.

9. The semiconductor device of claim 1, wherein a plurality of contact holes are formed in an insulating layer formed at least partially over said support member, and wherein the interconnection layer extends at least partially at different locations into respective ones of said contact holes.

10. The semiconductor device of claim 9, wherein said semiconductor device comprises a heterojunction bipolar transistor (HBT), and wherein said interconnection layer is conductive and in electrical communication with a base electrode, a collector electrode, and an emitter of said HBT through said contact holes.

11. The semiconductor device of claim 1, wherein said top surface of the support member comprises a smooth profile with smoothly transitions from the first height to the second height in a non-stepped manner and wherein the smooth profile includes first and second parallel portions that define different planes, and wherein the second height is greater than the first height.

* * * * *